(12) United States Patent
Lynch et al.

(10) Patent No.: US 8,058,935 B2
(45) Date of Patent: Nov. 15, 2011

(54) SCALABLE MILLIMETER WAVE POWER SOURCE

(75) Inventors: Jonathan James Lynch, Oxnard, CA (US); Perry A. Macdonald, Newbury Park, CA (US)

(73) Assignee: The Boeing Company, Chicago, IL (US)

(*) Notice: Subject to any disclaimer, the term of this patent is extended or adjusted under 35 U.S.C. 154(b) by 42 days.

(21) Appl. No.: 12/701,005

(22) Filed: Feb. 5, 2010

(65) Prior Publication Data
US 2011/0193659 A1 Aug. 11, 2011

(51) Int. Cl.
*H03L 7/24* (2006.01)
*H03B 1/00* (2006.01)
*H01Q 21/00* (2006.01)
*H03H 2/00* (2006.01)

(52) U.S. Cl. ........... 331/55; 331/74; 331/96; 331/107 P; 331/172; 333/208; 343/776; 343/824; 343/853; 343/893; 359/333

(58) Field of Classification Search .................. 331/46, 331/47, 55, 56, 74, 76, 79–84, 96, 107 DP, 331/107 P, 172; 343/751, 772, 776, 777, 343/786, 824, 826, 853, 893; 359/333; 333/24 R, 333/208
See application file for complete search history.

(56) References Cited

U.S. PATENT DOCUMENTS

| | | | |
|---|---|---|---|
| 3,628,171 A * | 12/1971 | Kurokawa et al. | 331/56 |
| 4,496,913 A * | 1/1985 | Wandinger et al. | 331/56 |
| 4,583,055 A | 4/1986 | Yen et al. | |
| 5,214,394 A * | 5/1993 | Wong | 330/286 |
| 5,317,286 A | 5/1994 | Geddes | |
| 6,538,793 B2 | 3/2003 | Rosenberg et al. | |
| 7,184,205 B1 * | 2/2007 | Lynch | 359/333 |

OTHER PUBLICATIONS

Mink, "Quasi-Optical Power Combining of Solid-State Millimeter-Wave Sources", IEEE Transactions on Microwave Theory and Techniques, vol MTT-34, No. 2, Feb. 1986, pp. 273-279.
Mortazawi et al., "A Periodic Planar Gunn Diode Power Combining Oscillator", IEEE Transactions on Microwave Theory and Techniques, vol. 38, No. 1, Jan. 1990, pp. 86-87.
Mortazawi et al., "A Periodic Second Harmonic Spatial Power Combining Oscillator", IEEE Transactions on Microwave Theory and Techniques, vol. 40, No. 5, May 1992, pp. 851-857.
Popovic et al., "Bar-Grid Oscillators", IEEE Transactions on Microwave Theory and Techniques, vol. 38, No. 3, Mar. 1990, pp. 225-230.
Kurokawa, "The Single-Cavity Multiple-Device Oscillator", IEEE Transactions on Microwave Theory and Techniques, vol. MTT-19, No. 10, Oct. 1971, pp. 793-801.

* cited by examiner

*Primary Examiner* — Robert Pascal
*Assistant Examiner* — Levi Gannon
(74) *Attorney, Agent, or Firm* — Yee & Associates, P.C.

(57) ABSTRACT

An apparatus comprises a structure, an array of oscillator units, a plurality of waveguides in the structure, and a synchronizing cavity located within the structure. The array of oscillator units has a plurality of rows and a plurality of columns associated with the structure. Oscillator units in a row within the array of oscillator units are directly coupled to each other. The plurality of waveguides is configured to couple the array of oscillator units to the synchronizing cavity. The synchronizing cavity is configured to cause the array of oscillator units to operate at substantially a common frequency.

22 Claims, 8 Drawing Sheets

SCALABLE MILLIMETER WAVE POWER SOURCE

BACKGROUND INFORMATION

1. Field

The present disclosure relates generally to power and, in particular, to a method and apparatus for generating electromagnetic waves. Still more particularly, the present disclosure relates to a method and apparatus for generating electromagnetic waves having millimeter wave frequencies using oscillators.

2. Background

Electromagnetic waves may have a number of different applications. For example, electromagnetic waves may be used in communications, remote sensing, navigation, spectroscopy, heat generation, weapons generation, and other suitable applications. One example of the use of electromagnetic waves in weapons generation is a directed energy weapon (DEW). A directed energy weapon is a weapon that emits energy in an aimed direction without the means of a projectile. The energy emitted by a directed energy weapon is transferred to a target for a desired effect.

For example, a directed energy weapon may emit electromagnetic waves in the form of microwaves having a frequency within a selected range. These microwaves may be millimeter waves. Millimeter waves have frequencies between about 30 gigahertz and about 300 gigahertz. Further, millimeter waves have wavelengths from about one millimeter to about 10 millimeters. The Active Denial System (ADS) is one example of a directed energy weapon that emits millimeter waves.

As another example, electromagnetic waves may be used to communicate between two locations. Electromagnetic waves in the form of a beam may be transmitted from a source to a target. The beam may be modulated to include information for communications. As a more specific example, a submarine on the surface of the water may transmit information to a ship using electromagnetic waves in the form of a beam.

Currently existing electromagnetic wave sources may require more resources for operation of these sources than desired. These resources include, for example, time, space, components, power supply, and/or other suitable resources. Further, currently existing electromagnetic wave sources may not have scalability. Scalability is the ability of a system to be physically expanded to handle growing workloads.

Therefore, it would be advantageous to have a method and apparatus that takes into account one or more of the issues discussed above, as well as possibly other issues.

SUMMARY

In one advantageous embodiment, an apparatus comprises a structure, an array of oscillator units, a plurality of waveguides in the structure, and a synchronizing cavity located within the structure. The array of oscillator units has a plurality of rows and a plurality of columns associated with the structure. Oscillator units in a row within the array of oscillator units are directly coupled to each other. The plurality of waveguides is configured to couple the array of oscillator units to the synchronizing cavity. The synchronizing cavity is configured to cause the array of oscillator units to operate at substantially a common frequency.

In another advantageous embodiment, an apparatus comprises a structure, an array of oscillator units, a first plurality of waveguides, a synchronizing cavity, an absorbing cavity, an absorbing material, a second plurality of waveguides, and an antenna system. The structure has a first plate and a second plate. The first plate and the second plate are substantially parallel to each other. The array of oscillator units has a plurality of rows and a plurality of columns associated with the structure. Oscillator units in a row in the array of oscillator units are directly coupled to each other. The first plurality of waveguides is located in the first plate of the structure. The synchronizing cavity is located between the first plate and the second plate of the structure. The first plurality of waveguides is configured to couple the array of oscillator units to the synchronizing cavity. The synchronizing cavity is configured to cause the array of oscillator units to operate at a common frequency. The absorbing cavity is located in the structure. The second plate of the structure separates the synchronizing cavity from the absorbing cavity. A number of slots within the second plate couples the synchronizing cavity to the absorbing cavity. The number of slots is configured to direct electromagnetic waves having a mode other than a desired mode into the absorbing cavity. The absorbing material is located in the absorbing cavity. The absorbing material is configured to absorb the electromagnetic waves that enter the absorbing cavity. The second plurality of waveguides is located in the structure. The antenna system is associated with the structure. The second plurality of waveguides is configured to couple the array of oscillator units to the antenna system.

In yet another advantageous embodiment, a method is present for generating electromagnetic waves. An array of oscillator units is operated to generate electromagnetic waves having a frequency. The array of oscillator units has a plurality of rows and a plurality of columns associated with the structure. Oscillator units in a row within the array of oscillator units are directly connected to each other. The electromagnetic waves having the frequency are guided through a plurality of waveguides in the structure into a synchronizing cavity located within the structure. The plurality of waveguides is configured to couple the array of oscillator units to the synchronizing cavity. A portion of the electromagnetic waves in the synchronizing cavity is absorbed into an absorbing cavity using an absorbing material located within the absorbing cavity. The portion of the electromagnetic waves absorbed has modes other than a desired mode for the electromagnetic waves. At least a portion of remaining electromagnetic waves in the synchronizing cavity are guided back through the plurality of waveguides to the array of oscillator units. The array of oscillator units is allowed to operate at a common frequency in response to energy in at least a portion of the remaining electromagnetic waves guided back through the plurality of waveguides to the array of oscillator units. The electromagnetic waves generated by the array of oscillator units have the common frequency.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives, and advantages thereof, will best be understood by reference to the following detailed description of an advantageous embodiment of the present disclosure when read in conjunction with the accompanying drawings, wherein:

DETAILED DESCRIPTION

The different advantageous embodiments recognize and take into account a number of different considerations. A number, as used herein with reference to items, refers to one or more items. For example, a number of considerations is one or more considerations. The different advantageous embodiments recognize and take into account that currently used power generation systems employ vacuum tube-based approaches. These types of systems require warm-up times that are often longer than desired. For example, a tube-based system that generates millimeter wave electromagnetic signals may require about 24 hours of warm-up time. Additionally, these types of tube-based systems require large, high-voltage power supplies. Further, the power supplies for these systems also require cooling. As a result, these types of systems may take up more space than desired.

Thus, the different advantageous embodiments provide a method and apparatus for generating electromagnetic waves. In one or more advantageous embodiments, an apparatus comprises a structure, an array of oscillator units, a plurality of waveguides, and a cavity. The array of oscillator units has a plurality of rows and a plurality of columns on the structure. Oscillator units within the array of oscillator units in a row are directly coupled to each other. The plurality of waveguides is found within the structure. The cavity is located within the structure. The plurality of waveguides is configured to couple the array of oscillator units to the cavity. The cavity is configured to cause the array of oscillator units to operate at a common frequency.

In other advantageous embodiments, the cavity is a first cavity, and a second cavity is also located within a coupling structure. The second cavity is configured to receive electromagnetic signals generated by the oscillators that have a mode other than a desired mode into the second cavity. An absorbing material in the second cavity is configured to absorb the electromagnetic signals that enter the second cavity.

Figure 1:
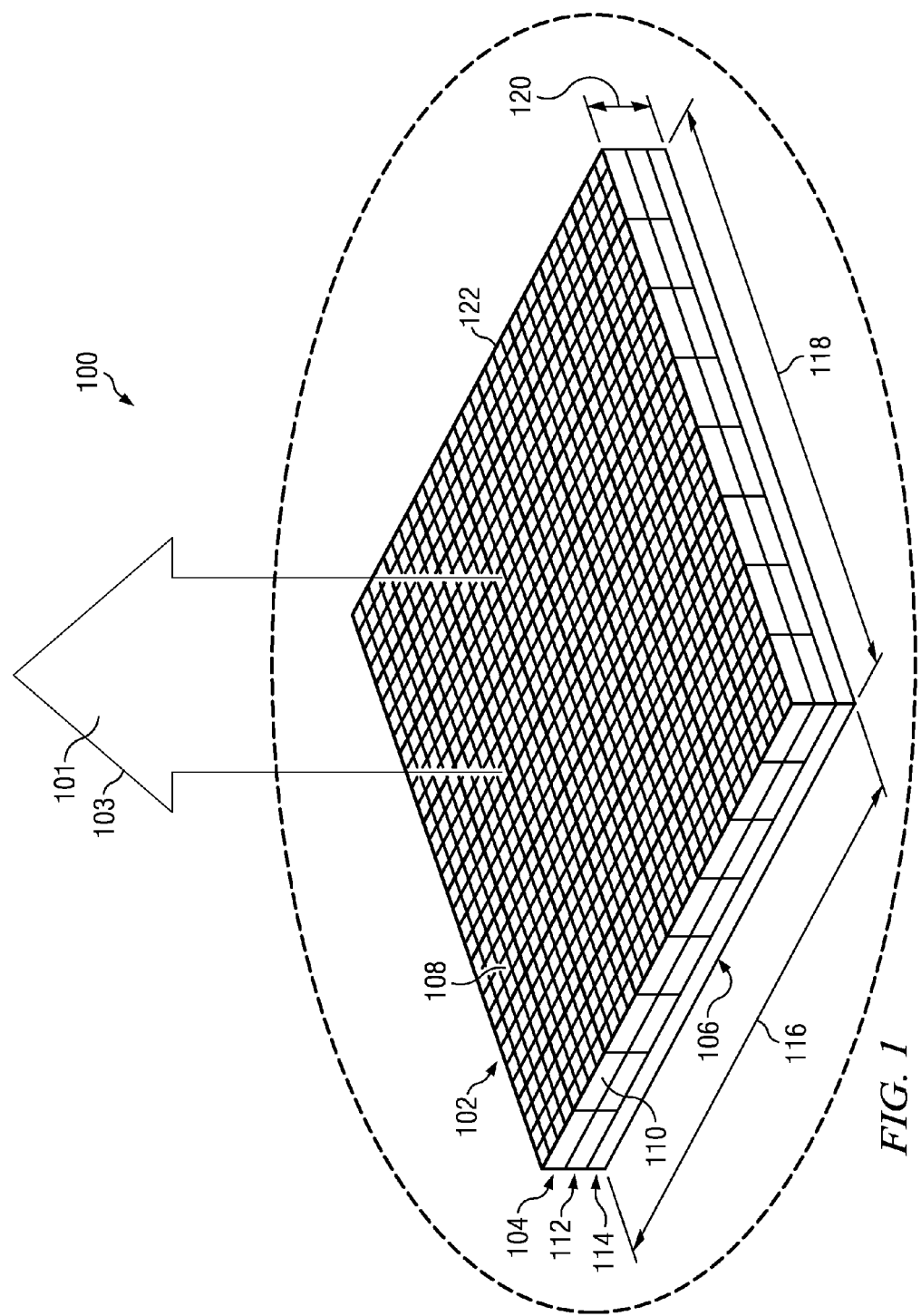
FIG. 1 is an illustration of an electromagnetic wave source in accordance with an advantageous embodiment.

With reference now to FIG. 1, an illustration of an electromagnetic wave source is depicted in accordance with an advantageous embodiment. In these illustrative examples, electromagnetic wave source 100 is used to emit electromagnetic radiation 101. Electromagnetic radiation 101 takes the form of electromagnetic waves. More specifically, electromagnetic radiation 101 takes the form of millimeter waves.

In this illustrative example, electromagnetic radiation 101 is emitted at a frequency of about 95 gigahertz. As depicted, electromagnetic radiation 101 may be emitted as beam 103. Beam 103 is a substantially collimated beam in these examples. In other words, beam 103 remains substantially the same size as beam 103 travels away from electromagnetic wave source 100. Further, beam 103 travels in a manner consistent with the principles of electromagnetic diffraction.

In these illustrative examples, electromagnetic wave source 100 includes antenna system 102, electromagnetic wave generation system 104, and structure 106. Antenna system 102 is comprised of antennas 108. Antennas 108 take the form of openings through which electromagnetic radiation 101 is emitted. In these illustrative examples, antennas 108 may be horn antennas.

Antenna system 102 and electromagnetic wave generation system 104 are associated with structure 106. A first component may be considered to be associated with a second component by being secured to the second component, bonded to the second component, fastened to the second component, and/or connected to the second component in some other suitable manner. The first component also may be connected to the second component by using a third component. The first component may also be considered to be associated with the second component by being formed as part of and/or as an extension of the second component. The first component may be located inside or on the second component when the first component is associated with the second component.

In these illustrative examples, electromagnetic wave generation system 104 is configured to generate electromagnetic radiation 101. Electromagnetic wave generation system 104 takes the form of monolithic microwave integrated circuit (MMIC) layer 110. Monolithic microwave integrated circuit layer 110 is a layer of integrated circuit (IC) devices that operate at millimeter wave frequencies in these illustrative examples. Millimeter wave frequencies are between about 30 gigahertz and about 300 gigahertz.

Structure 106 includes synchronization system 112 and absorption system 114. Structure 106 may be comprised of a material selected from at least one of, for example, without limitation, a metal, a metal alloy, aluminum, brass, copper, a metal-coated plastic, and other suitable materials.

In these illustrative examples, the configuration of electromagnetic wave source 100 allows electromagnetic wave source 100 to be scaled. For example, electromagnetic wave source 100 may be scaled in size and/or may have different shapes, depending on the implementation. In this illustrative example, electromagnetic wave source 100 has length 116, width 118, and depth 120. Length 116 is about 3.6 inches, width 118 is about 3.6 inches, and depth 120 is about 1.0 inch. Of course, in other illustrative examples, electromagnetic wave source 100 may have a different length 116, width 118, and/or depth 120.

As another example, electromagnetic wave source 100 has square shape 122. However, in other examples, electromagnetic wave source 100 may have some other suitable shape, such as, for example, a circular shape, an oval shape, a rectangular shape, or some other suitable shape.

Figure 2:
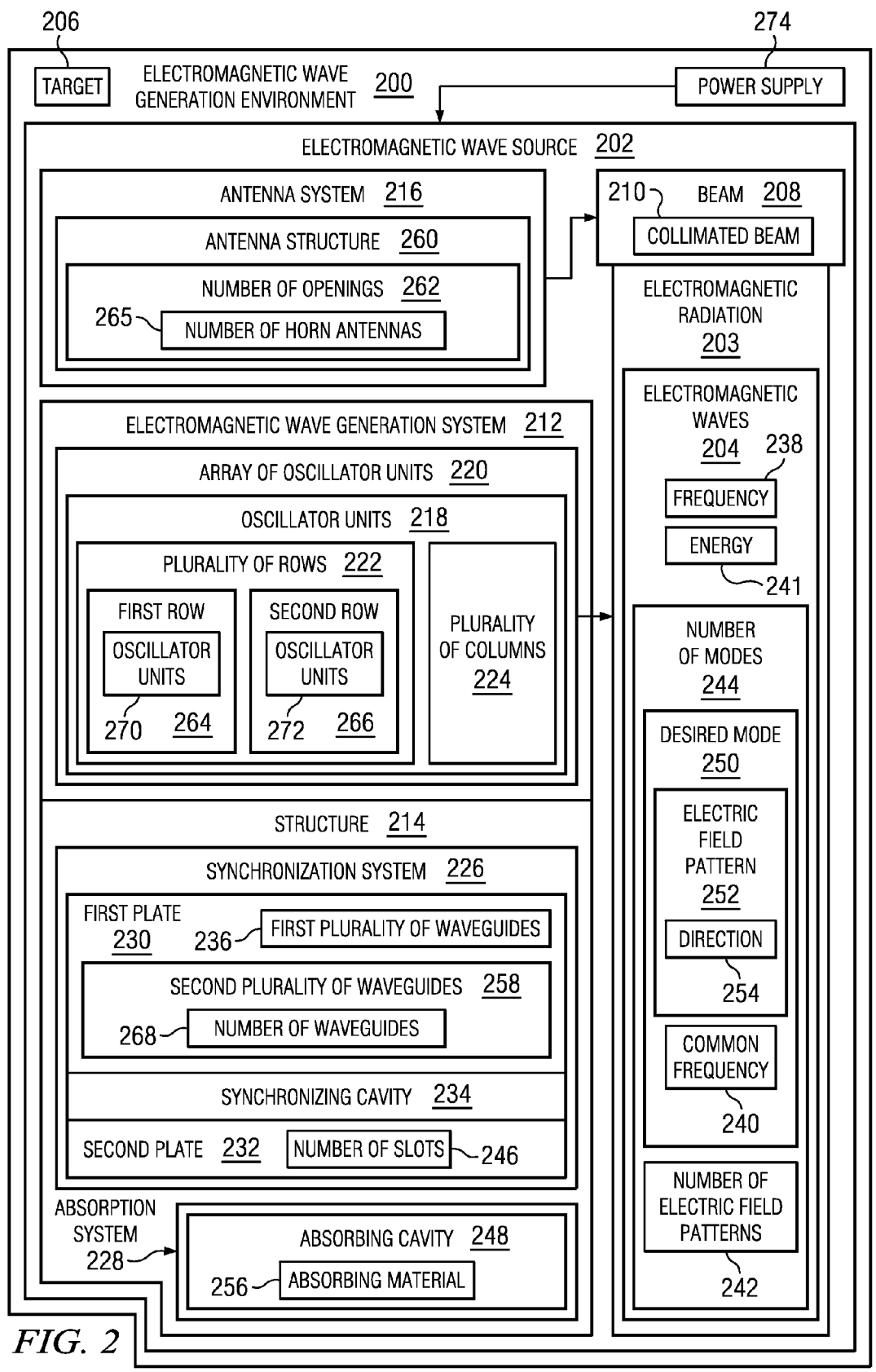
FIG. 2 is an illustration of an electromagnetic wave generation environment in accordance with an advantageous embodiment.

With reference now to FIG. 2, an illustration of an electromagnetic wave generation environment is depicted in accordance with an advantageous embodiment. In these illustrative examples, electromagnetic wave generation environment 200 includes electromagnetic wave source 202. Electromagnetic wave source 202 may be used to implement electromagnetic wave source 100 in FIG. 1.

Electromagnetic wave source 202 generates electromagnetic radiation 203. Electromagnetic radiation 203 takes the form of electromagnetic waves 204. Electromagnetic waves 204 are directed towards target 206 in these illustrative examples. Electromagnetic waves 204 propagate towards target 206 in the form of beam 208.

In these illustrative examples, beam 208 takes the form of collimated beam 210. Collimated beam 210 is a beam that remains substantially the same size when traveling from electromagnetic wave source 202 to target 206.

In these illustrative examples, electromagnetic waves 204 may be used in a number of different ways. For example, electromagnetic wave source 202 may take a number of different forms, such as, for example, without limitation, a directed energy weapon, a communications system, a radar transmitter, a heat generation system, and other suitable forms. Target 206 may take a number of different forms, such as, for example, a building, a corridor, a ship, an open area, a satellite, or some other suitable type of target.

In these illustrative examples, electromagnetic wave source 202 includes electromagnetic wave generation system 212, structure 214, and antenna system 216. Electromagnetic wave generation system 212 is comprised of array of oscillator units 220. Array of oscillator units 220 is arranged in plurality of rows 222 and plurality of columns 224. Array of oscillator units 220 is configured to generate electromagnetic waves 204. In particular, array of oscillator units 220 is configured to generate electromagnetic waves 204 having frequency 238.

Oscillator units within a row in plurality of rows 222 may be coupled to each other. For example, each oscillator unit in a row in plurality of rows 222 may be coupled to the oscillator units immediately adjacent to the oscillator unit.

In these illustrative examples, oscillator units 218 in array of oscillator units 220 oscillate with odd symmetry. In these illustrative examples, oscillation is repetitive variation about a central value or between two or more different states. For example, oscillator units 218 may generate electromagnetic waves 204 with a sinusoidal shape. Odd symmetry occurs when the voltage at one side of an oscillator unit is positive, and the voltage on the other side of the oscillator unit is negative.

Array of oscillator units 220 is associated with structure 214. Structure 214 includes synchronization system 226 and absorption system 228. In these illustrative examples, synchronization system 226 comprises first plate 230, second plate 232, and synchronizing cavity 234. First plate 230 and second plate 232 are substantially parallel to each other. Synchronizing cavity 234 is located between first plate 230 and second plate 232. Synchronizing cavity 234 is a first cavity in structure 214.

As depicted, first plurality of waveguides 236 is located within first plate 230. First plurality of waveguides 236 is configured to couple array of oscillator units 220 to synchronizing cavity 234. In other words, electromagnetic waves 204 generated by array of oscillator units 220 are allowed to travel through first plurality of waveguides 236 to synchronizing cavity 234.

First plurality of waveguides 236 is configured to allow electromagnetic waves 204 having frequency 238 to travel through first plurality of waveguides 236. For example, the dimensions for first plurality of waveguides 236 are selected to allow electromagnetic waves 204 having frequency 238 to travel through first plurality of waveguides 236.

Synchronizing cavity 234 is configured to synchronize array of oscillator units 220 such that array of oscillator units 220 generates electromagnetic waves 204 at common frequency 240 in desired mode 250. In other words, array of oscillator units 220 is adjusted such that each oscillator unit in array of oscillator units 220 operates at common frequency 240 and in substantially desired mode 250.

Desired mode 250 for electromagnetic waves 204 includes an electric field pattern and a magnetic field pattern for electromagnetic waves 204. In these illustrative examples, desired mode 250 includes common frequency 240 for electromagnetic waves 204.

In synchronizing cavity 234, electromagnetic waves 204 for each of array of oscillator units 220 are combined in synchronizing cavity 234. Further, energy 241 in electromagnetic waves 204 is combined in synchronizing cavity 234. In other words, energy 241 from the electric fields and magnetic fields for electromagnetic waves 204 in synchronizing cavity 234 are added together. In this manner, energy 241 in electromagnetic waves 204 generated by each of array of oscillator units 220 is coupled to other oscillator units within array of oscillator units 220.

At least a portion of electromagnetic waves 204 carrying at least a portion of energy 241 travels from synchronizing cavity 234 back through first plurality of waveguides 236 to array of oscillator units 220. Array of oscillator units 220 is configured to couple this portion of energy 241 to array of oscillator units 220. In response to coupling this portion of energy 241, array of oscillator units 220 is configured such that frequency 238 of oscillation of array of oscillator units 220 synchronizes to common frequency 240.

In this manner, electromagnetic waves 204 generated by an oscillator unit in array of oscillator units 220 may be used to synchronize other oscillator units in array of oscillator units 220 to common frequency 240.

Electromagnetic waves 204 generate number of electric field patterns 242 for number of modes 244 for electromagnetic waves 204. In other words, each electric field pattern in number of electric field patterns 242 corresponds to a mode in number of modes 244 for electromagnetic waves 204. In these illustrative examples, desired mode 250 for electromagnetic waves 204 includes electric field pattern 252 at common frequency 240. Electric field pattern 252 has direction 254. Direction 254 may be substantially parallel to first plate 230 and second plate 232. In desired mode 250, oscillator units in a row in plurality of rows 222 are in phase with each other.

Second plate 232 of synchronization system 226 contains number of slots 246. Number of slots 246 couples synchronizing cavity 234 to absorption system 228. Absorption system 228 comprises absorbing cavity 248. Absorbing cavity 248 is a second cavity in structure 214. Number of slots 246 couples synchronizing cavity 234 to absorbing cavity 248. As depicted, second plate 232 forms a lower surface for synchronizing cavity 234 and an upper surface for absorbing cavity 248.

Number of slots 246 is configured to allow electromagnetic waves 204 in synchronizing cavity 234 with modes in number of modes 244 other than desired mode 250 to be absorbed into absorbing cavity 248. For example, number of slots 246 is aligned on second plate 232 in a direction substantially parallel to direction 254 for electric field pattern 252. This alignment of number of slots 246 in direction 254 for electric field pattern 252 for desired mode 250 prevents electromagnetic waves 204 with desired mode 250 in synchronizing cavity 234 from being coupled to and absorbed into absorbing cavity 248.

In these illustrative examples, absorbing cavity 248 contains absorbing material 256. Absorbing material 256 may be selected from at least one of a carbon impregnated foam material, a ferrite-based material, iron impregnated silicone, urethane sheets, and other suitable materials. For example, absorbing material 256 may be Eccosorb® as manufactured by Emerson and Cuming Microwave Products. Absorbing material 256 absorbs electromagnetic waves 204 with modes in number of modes 244 other than desired mode 250.

In these depicted examples, antenna system 216 is comprised of antenna structure 260 with number of openings 262 in antenna structure 260. Number of openings 262 takes the form of number of horn antennas 265. Number of openings 262 may be coupled to array of oscillator units 220 through second plurality of waveguides 258. In other words, second plurality of waveguides 258 couples array of oscillator units 220 to number of openings 262. Further, second plurality of waveguides 258 opens into number of openings 262 in antenna structure 260.

In this manner, electromagnetic radiation 203 generated by array of oscillator units 220 may be emitted through second plurality of waveguides 258 into number of openings 262. Electromagnetic radiation 203 may then be emitted through number of openings 262.

Second plurality of waveguides 258 is located in first plate 230 for structure 214. In these depicted examples, second plurality of waveguides 258 may be substantially equal to number of openings 262. Second plurality of waveguides 258 is located between rows in plurality of rows 222 for array of oscillator units 220. For example, plurality of rows 222 may include first row 264 and second row 266. Number of waveguides 268 in second plurality of waveguides 258 may be located between first row 264 and second row 266.

First row 264 and second row 266 are adjacent to each other in these illustrative examples. In other words, other rows are not present between first row 264 and second row 266. Oscillator units 270 in first row 264 are about 180 degrees out of phase from oscillator units 272 in second row 266.

In these illustrative examples, array of oscillator units 220 may receive power from power supply 274. Power supply 274 may be, for example, a direct current (DC) power supply. Power supply 274 may be connected to each of array of oscillator units 220 in these examples.

The illustration of electromagnetic wave generation environment 200 in FIG. 2 is not meant to imply physical or architectural limitations to the manner in which other advantageous embodiments may be implemented. The first component also may be coupled to the second component by one or more other components. For example, one electronic device may be coupled to another electronic device without any additional electronic devices between the first electronic device. In some cases, another electronic device may be present between the two electronic devices connected to each other.

In other advantageous embodiments, number of openings 262 may take the form of antennas other than number of horn antennas 265. In these advantageous embodiments, each of second plurality of waveguides 258 may correspond to an opening in number of openings 262. In other advantageous embodiments, second plurality of waveguides 258 may open into a single horn antenna.

Figure 3:
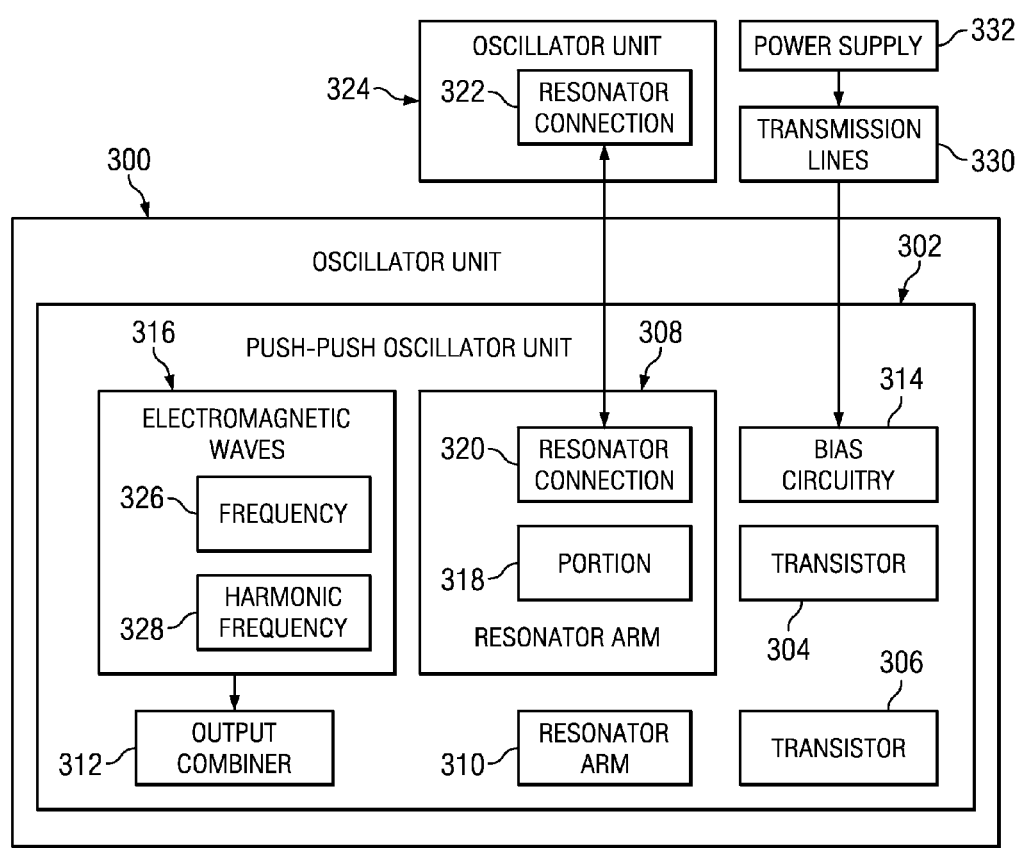
FIG. 3 is an illustration of a block diagram of an oscillator unit in accordance with an advantageous embodiment.

With reference now to FIG. 3, an illustration of a block diagram of an oscillator unit is depicted in accordance with an advantageous embodiment. In this illustrative example, oscillator unit 300 is an example of one implementation for an oscillator unit within array of oscillator units 220 in FIG. 2. Oscillator unit 300 takes the form of push-push oscillator unit 302 in this illustrative example.

Push-push oscillator unit 302 may be formed as an integrated circuit on a semiconductor substrate. This semiconductor substrate takes the form of a gallium nitride (GaN) substrate. In these examples, push-push oscillator unit 302 is formed as part of a gallium nitride monolithic microwave integrated circuit device.

Oscillator unit 300 is comprised of transistor 304, transistor 306, resonator arm 308, resonator arm 310, output combiner 312, and bias circuitry 314. In these illustrative examples, transistor 304 and transistor 306 are gallium nitride (GaN) field-effect transistors. In other advantageous embodiments, other substrates may be used in place of gallium nitride. For example, gallium arsenide may be used. As depicted, transistor 304 and transistor 306 are interconnected.

Resonator arm 308, resonator arm 310, transistor 304, and transistor 306 are configured to generate electromagnetic waves 316. A portion of at least one of resonator arm 308 and resonator arm 310 may be removed from the resonator arms to allow connection to a resonator arm for a different oscillator unit. For example, portion 318 may be removed from resonator arm 308 to form resonator connection 320. Resonator connection 320 may be electrically connected to a synchronizing cavity, such as synchronizing cavity 234 in FIG. 2. With this type of configuration, synchronizing cavity 234 may function as the resonator for oscillator unit 300.

Resonator connection 320 allows oscillator unit 300 to be directly coupled to another oscillator unit and to a synchronizing cavity. A first component may be directly coupled to a second component by being connected without using one or more intervening devices. Coupling may occur with or without the use of one or more intervening devices.

For example, a transmission line may be bonded to resonator connection 320 and to resonator connection 322 for oscillator unit 324. This transmission line may directly couple oscillator unit 300 to oscillator unit 324. In other words, electromagnetic waves may travel along the transmission line from oscillator unit 300 to oscillator unit 324 without using one or more intervening devices.

In these illustrative examples, oscillator unit 300 is configured to operate with frequency 326. Frequency 326 is selected to be about 47.5 gigahertz in these examples. Frequency 326 is a fundamental frequency for oscillator unit 300. Output combiner 312 is configured to reflect frequency 326, while allowing harmonic frequency 328 to pass. In other words, output combiner 312 transmits electromagnetic waves 316 with harmonic frequency 328 as output for oscillator unit 300. Harmonic frequency 328 is a second harmonic frequency for frequency 326. In these examples, harmonic frequency 328 is about 95 gigahertz.

Bias circuitry 314 is configured to receive power through transmission lines 330. Transmission lines 330 may deliver power from power supply 332 to oscillator unit 300. Power supply 332 may be a direct current power supply in these illustrative examples.

Figure 4:
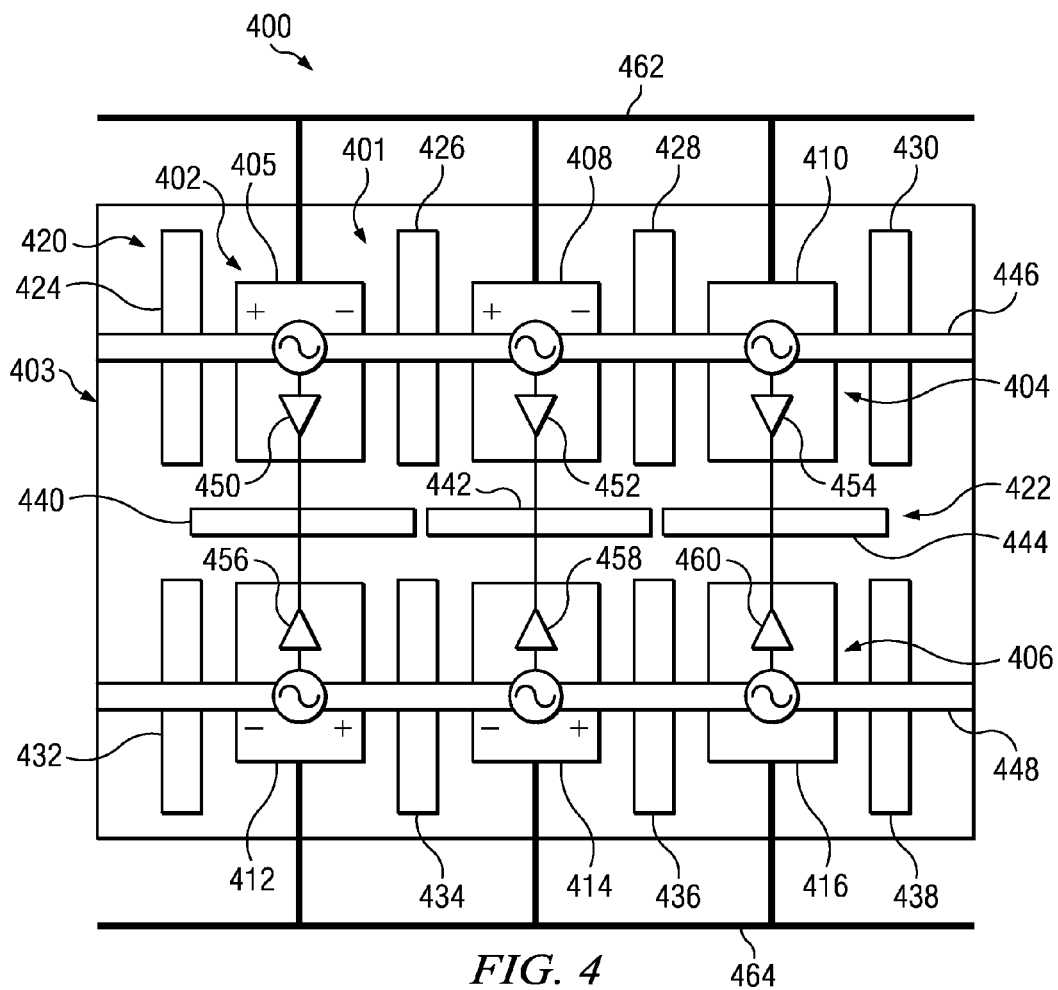
FIG. 4 is an illustration of a top view of a portion of an electromagnetic wave source in accordance with an advantageous embodiment.

With reference now to FIG. 4, an illustration of a top view of a portion of an electromagnetic wave source is depicted in accordance with an advantageous embodiment. In this illustrative example, electromagnetic wave source 400 is an example of one implementation for electromagnetic wave source 202 in FIG. 2.

Electromagnetic wave source 400 includes electromagnetic wave generation system 401 and structure 403. Electromagnetic wave generation system 401 includes array of oscillator units 402. The oscillator units in array of oscillator units 402 are examples of one implementation for oscillator unit 300 in FIG. 3. As depicted, array of oscillator units 402 has first row 404 and second row 406. First row 404 includes oscillator units 405, 408, and 410. Second row 406 includes oscillator units 412, 414, and 416.

The oscillator units in first row 404 are configured to oscillate out of phase from the oscillator units in second row 406. For example, oscillator units 405, 408, and 410 in first row 404 oscillate about 180 degrees out of phase from oscillator units 412, 414, and 416 in second row 406.

Each of the oscillator units in first row 404 is coupled to the adjacent oscillator units in first row 404. For example, oscillator unit 405 is coupled to oscillator unit 408. Further, each of the oscillator units in second row 406 is coupled to the adjacent oscillator units in second row 406. For example, oscillator unit 414 is coupled to oscillator unit 412 and oscillator unit 416.

In this illustrative example, oscillator units 405, 408, 410, 412, 414, and 416 are formed as integrated circuits on a semiconductor substrate. The semiconductor substrate is gallium nitride in these examples. Oscillator units 405, 408, 410, 412, 414, and 416 take the form of gallium nitride monolithic microwave integrated circuits.

Each oscillator unit in array of oscillator units 402 is configured to operate at a substantially common frequency. This common frequency is a millimeter wave frequency. In particular, the millimeter wave frequency is about 47.5 gigahertz.

Further, each oscillator unit in array of oscillator units 402 is configured to operate with odd symmetry about a central line of symmetry for each of array of oscillator units 402. For example, oscillator unit 412 is configured to operate with odd symmetry. In other words, one side of oscillator unit 412 is excited with a positive voltage, while the other side of oscillator unit 412 is excited with a negative voltage.

In this depicted example, electromagnetic wave source 400 also includes first plurality of waveguides 420 and second plurality of waveguides 422. First plurality of waveguides 420 includes waveguides 424, 426, 428, 430, 432, 434, 436, and 438. Second plurality of waveguides 422 includes waveguides 440, 442, and 444.

First plurality of waveguides 420 and second plurality of waveguides 422 are located in structure 403. Array of oscillator units 402 is coupled to first plurality of waveguides 420 through transmission line 446 and transmission line 448.

For example, transmission line 446 directly couples oscillator units 405, 408, and 410 to each other. Further, oscillator units 405, 408, and 410 are coupled to waveguides 424, 426, 428, and 430. Transmission line 448 couples oscillator units 412, 414, and 416 to each other. Oscillator units 412, 414, and 416 are also coupled to waveguides 432, 434, 436, and 438.

In this illustrative example, oscillator units 405, 408, 410, 412, 414, and 416 are directly coupled to amplifiers 450, 452, 454, 456, 458, and 460, respectively. The oscillator units send electromagnetic waves to the amplifiers. The electromagnetic waves sent to the amplifiers have a second harmonic frequency of about 95 gigahertz in these examples. Amplifiers 450, 452, 454, 456, 458, and 460 are power amplifiers.

Amplifiers 450 and 452 are coupled to waveguide 440. Amplifiers 454 and 456 are coupled to waveguide 442. Amplifiers 458 and 460 are coupled to waveguide 444. Waveguides 440, 442, and 444 may couple to an antenna system, such as antenna system 216 in FIG. 2.

As depicted, transmission line 462 and transmission line 464 may provide power to array of oscillator units 402. This power may be supplied by a direct current source (not shown), for example.

Figure 5:
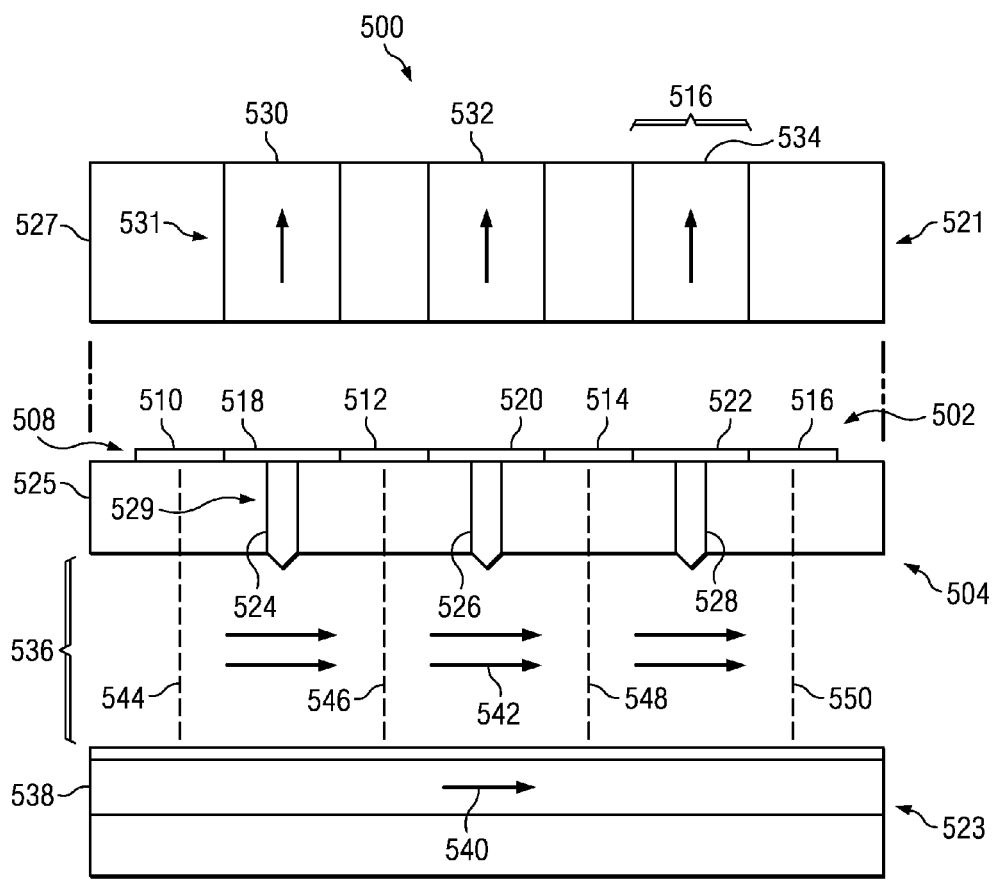
FIG. 5 is an illustration of a side view of an electromagnetic wave source in accordance with an advantageous embodiment.

With reference now to FIG. 5, an illustration of a side view of an electromagnetic wave source is depicted in accordance with an advantageous embodiment. In this illustrative example, electromagnetic wave source 500 is an example of one implementation for electromagnetic wave source 202 in FIG. 2.

Electromagnetic wave source 500 includes electromagnetic wave generation system 502 and structure 504. In this illustrative example, electromagnetic wave generation system 502 includes array of oscillator units 508. Array of oscillator units 508 includes oscillator units 510, 512, 514, and 516. Oscillator units 510, 512, 514, and 516 are directly coupled to each other through substrates 518, 520, and 522 in between the oscillator units. Transmission lines (not shown) directly couple array of oscillator units 508 to each other. These transmission lines may extend over substrates 518, 520, and 522 to directly couple each of array of oscillator units 508.

Substrates 518, 520, and 522 are comprised of a non-conducting material. For example, without limitation, substrates 518, 520, and 522 are comprised of a dielectric material. The dielectric material may be, for example, alumina, quartz, or some other suitable dielectric material.

Array of oscillator units 508 and substrates 518, 520, and 522 are associated with structure 504. Structure 504 is comprised of metal in this illustrative example. Structure 504 includes first plate 521 and second plate 523.

As depicted, first plate 521 includes first part 525 and second part 527. In this illustrative example, first part 525 and second part 527 are associated with each other. More specifically, when electromagnetic wave source 500 is assembled, first part 525 and second part 527 are attached to each other.

First part 525 of first plate 521 contains first plurality of waveguides 529. First plurality of waveguides 529 includes waveguides 524, 526, and 528. First plurality of waveguides 529 is coupled to array of oscillator units 508 in this illustrative example. Second part 527 of first plate 521 contains second plurality of waveguides 531. Second plurality of waveguides 531 includes waveguides 530, 532, and 534.

In this depicted example, first plurality of waveguides 529 and second plurality of waveguides 531 have walls comprised of a conducting material. This conducting material may be, for example, without limitation, a metal, a metal alloy, or some other suitable conducting material. As one illustrative example, first plurality of waveguides 529 may be lined with a conducting material. As another example, first plurality of waveguides 529 may be coated with a conducting material.

In still other illustrative examples, first plurality of waveguides 529 may be formed from a structure comprised of a conducting material. For example, first plate 521 may be a plate comprised of metal. First plurality of waveguides 529 may be machined into first plate 521.

In this illustrative example, oscillator units 510, 512, 514, and 516 generate electromagnetic waves. These electromagnetic waves travel through first plurality of waveguides 529 to synchronizing cavity 536. First plurality of waveguides 529 is configured to allow electromagnetic waves with a frequency of about 47.5 gigahertz to travel through the waveguides to synchronizing cavity 536. More specifically, the dimensions of first plurality of waveguides 529 are selected to allow electromagnetic waves with a frequency of about 47.5 gigahertz to travel through the waveguides.

As depicted, the electromagnetic waves generated by the different oscillator units are combined in synchronizing cavity 536. The electromagnetic waves in synchronizing cavity 536 carry energy in the electromagnetic waves. At least a portion of the electromagnetic waves carrying this energy travels from synchronizing cavity 536 back through first plurality of waveguides 529 to array of oscillator units 508.

For example, oscillator unit 510 may generate electromagnetic waves that travel through waveguide 524. These electromagnetic waves may be combined with other electromagnetic waves in synchronizing cavity 536. In this manner, the energy carried within the electromagnetic waves generated by oscillator unit 510 may be used to cause the other oscillator units in array of oscillator units 508 to operate at a common frequency.

In this illustrative example, the electromagnetic waves in synchronizing cavity 536 may have a number of modes. Each mode has an electric field pattern. The electromagnetic waves in synchronizing cavity 536 with a mode, other than a desired mode, are absorbed into absorbing cavity 538 through second plate 523. Second plate 523 is a plate with slots aligned in the direction of arrow 540. The desired mode may have an electric field pattern with direction 542. Direction 542 is a direction substantially parallel to the direction of arrow 540 in this illustrative example.

Second plurality of waveguides 531 is coupled to array of oscillator units 508. Second plurality of waveguides 531 is configured to allow electromagnetic waves having a frequency of about 95 gigahertz to travel from array of oscillator units 508 to an antenna system (not shown). This antenna system may be, for example, antenna system 216 in FIG. 2.

In this illustrative example, electromagnetic wave source 500 has planes of symmetry 544, 546, 548, and 550. These planes of symmetry are substantially normal to direction 542 of the electric field pattern for the desired mode. In different advantageous embodiments, sheets of conducting material may be placed along any of planes of symmetry 544, 546, 548, and 550 to form conducting sidewalls and scale electromagnetic wave source 500 in size. For example, a sheet of metal may be placed along plane of symmetry 548 to scale array of oscillator units 508 such that only oscillator unit 510 and oscillator unit 512 generate electromagnetic waves and are synchronized. This sheet of metal may form a substantially perfect electric conducting (PEC) wall.

Figure 6:
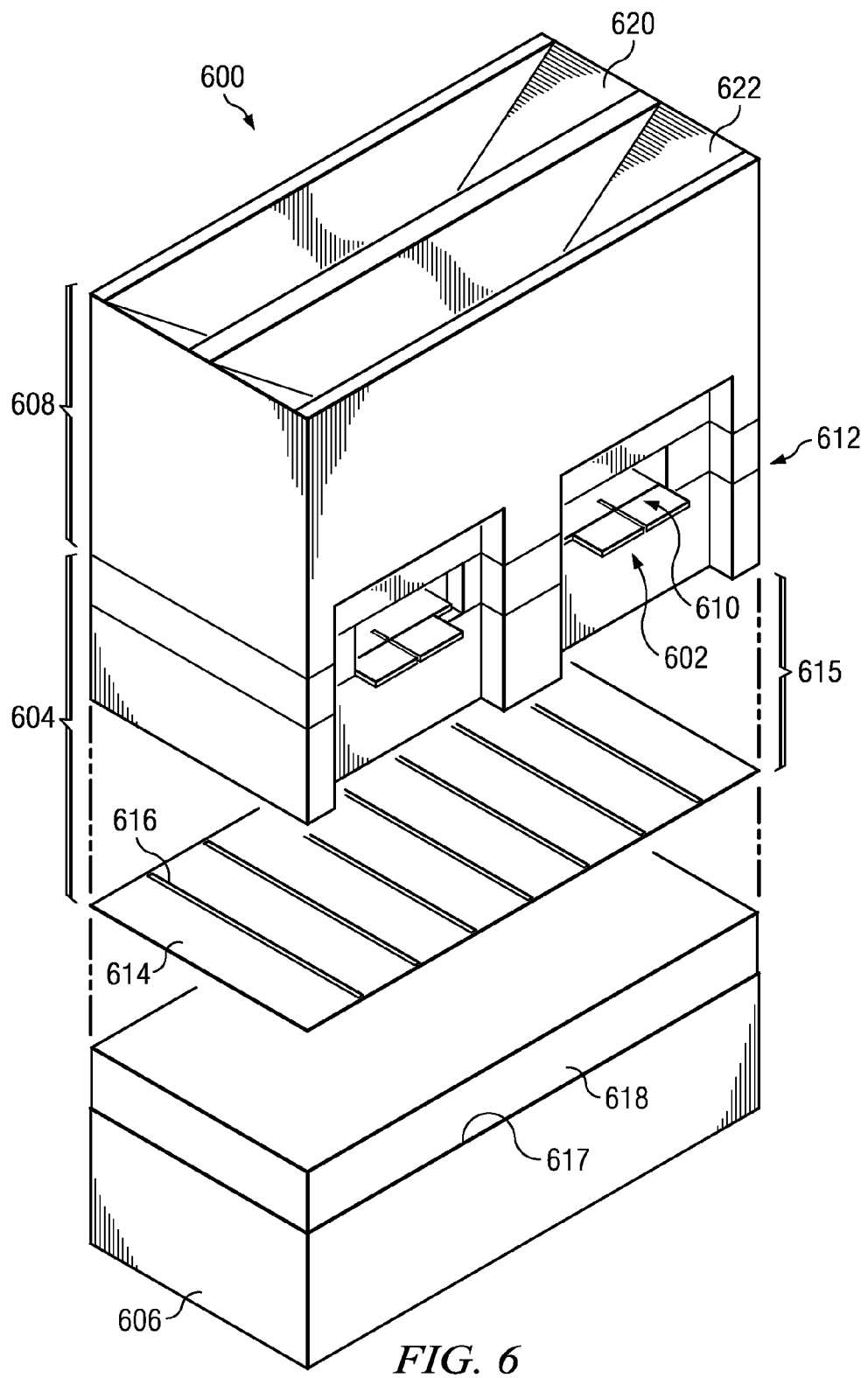
FIG. 6 is an illustration of a perspective view of an electromagnetic wave source in accordance with an advantageous embodiment.

With reference now to FIG. 6, an illustration of a perspective view of an electromagnetic wave source is depicted in accordance with an advantageous embodiment. In this illustrative example, electromagnetic wave source 600 is an example of one implementation for electromagnetic wave source 202 in FIG. 2.

Electromagnetic wave source 600 includes electromagnetic wave generation system 602, structure 604, base plate 606, and antenna system 608. Electromagnetic wave generation system 602 includes array of oscillator units 610. Structure 604 includes first plate 612 and second plate 614.

In this illustrative example, first plate 612 contains a first plurality of waveguides (not seen in this view) that open into synchronizing cavity 615. Second plate 614 contains slots 616. Slots 616 provide an opening from synchronizing cavity 615 to absorbing cavity 617. Absorbing cavity 617 is comprised of absorbing material 618 in this example.

First plate 612 also contains a second plurality of waveguides (not seen in this view) that open into antenna system 608. As depicted, antenna system 608 is associated with structure 604. Antenna system 608 includes horn antenna 620 and horn antenna 622 in this illustrative example.

Figure 7:
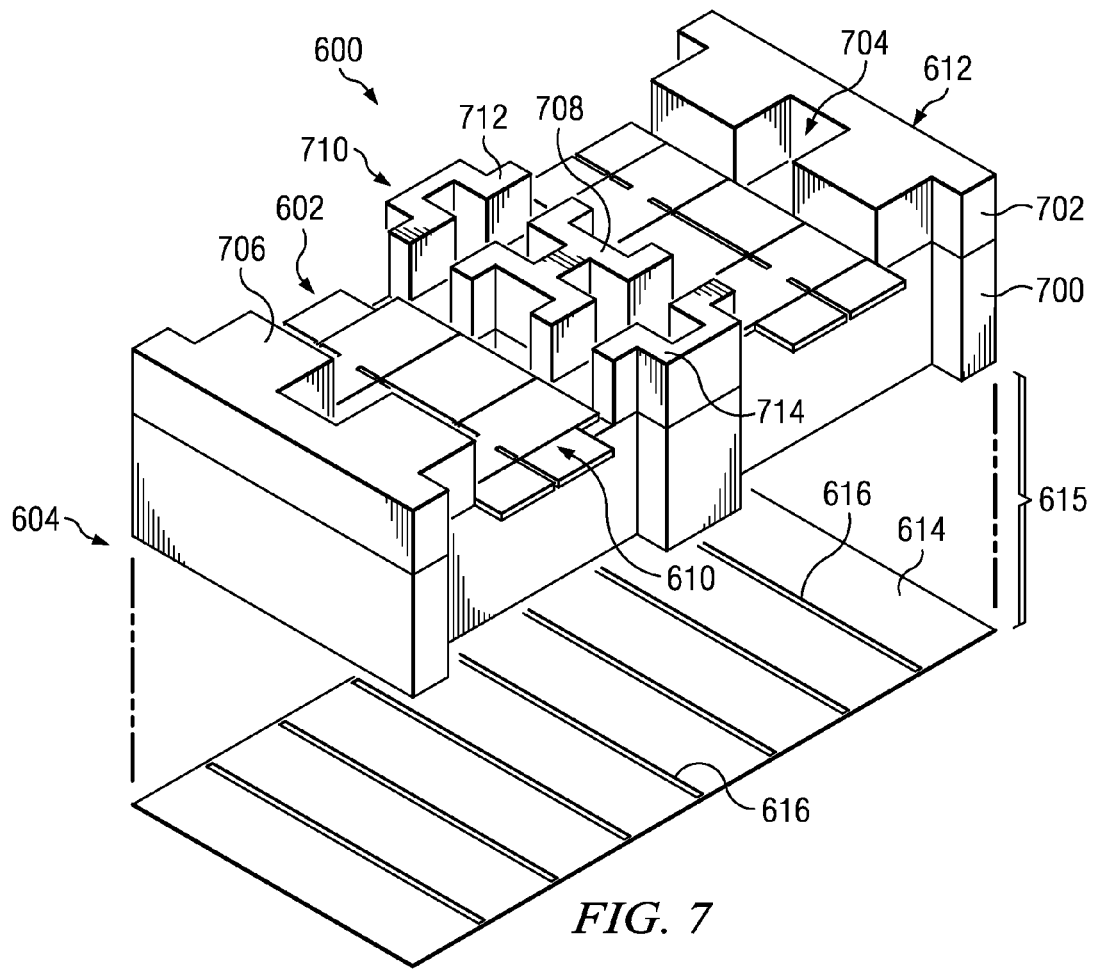
FIG. 7 is an illustration of a perspective view of a structure for an electromagnetic wave source in accordance with an advantageous embodiment.

With reference now to FIG. 7, an illustration of a perspective view of a structure for an electromagnetic wave source is depicted in accordance with an advantageous embodiment. In this illustrative example, structure 604 is seen with electromagnetic wave generation system 602 associated with structure 604.

Structure 604 includes first plate 612 and second plate 614. As depicted, first plate 612 includes first part 700 and second part 702. First part 700 contains first plurality of waveguides 704. First plurality of waveguides 704 includes waveguide 706 and waveguide 708. In this illustrative example, waveguide 706 and waveguide 708 are configured to allow electromagnetic waves having a frequency of about 47.5 gigahertz to travel through these waveguides.

Second part 702 of structure 604 contains second plurality of waveguides 710. Second plurality of waveguides 710 includes waveguide 712 and waveguide 714. In this illustrative example, waveguide 712 and waveguide 714 are configured to allow electromagnetic waves having a frequency of about 95 gigahertz to travel through these waveguides. Second plurality of waveguides 710 is configured to open into antenna system 608 in FIG. 6.

Figure 8:
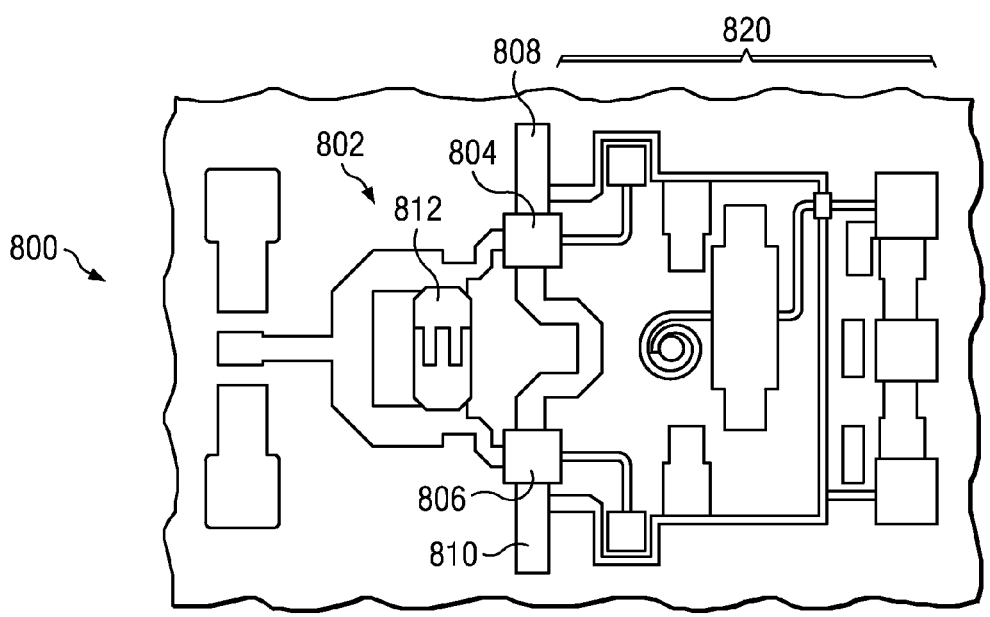
FIG. 8 is an illustration of an oscillator unit in accordance with an advantageous embodiment.

With reference now to FIG. 8, an illustration of an oscillator unit is depicted in accordance with an advantageous embodiment. In this illustrative example, oscillator unit 800 is an example of one implementation for an oscillator unit in array of oscillator units 220 in FIG. 2 and/or oscillator unit 300 in FIG. 3.

In this illustrative example, oscillator unit 800 takes the form of push-push oscillator 802. Push-push oscillator 802 may be formed as an integrated circuit on a semiconductor substrate. This semiconductor substrate may take the form of a gallium nitride (GaN) substrate. In these examples, push-push oscillator 802 is formed as part of a gallium nitride monolithic microwave integrated circuit device.

Oscillator unit 800 is comprised of transistor 804, transistor 806, resonator connection 808, resonator connection 810, output combiner 812, and bias circuitry 820. In these illustrative examples, transistor 804 and transistor 806 are gallium nitride (GaN) field-effect transistors. In other advantageous embodiments, other substrates may be used in place of gallium nitride. For example, silicon germanium may be used. As depicted, transistor 804 and transistor 806 are interconnected.

Resonator connection 808 and resonator connection 810 are configured to carry electromagnetic waves. Resonator connection 808 and resonator connection 810 also allow oscillator unit 800 to be directly coupled to other oscillator units and to a synchronizing cavity. For example, a transmission line may be bonded to resonator connection 808 to directly couple oscillator unit 800 to another oscillator unit.

In these illustrative examples, oscillator unit 800 is configured to operate at a frequency of about 47.5 gigahertz in these examples. This frequency is a fundamental frequency for oscillator unit 800. Output combiner 812 is configured to reflect electromagnetic waves with this fundamental frequency, while allowing electromagnetic waves with the second harmonic frequency to pass. In other words, output combiner 812 transmits electromagnetic waves with a second harmonic frequency of about 95 gigahertz. In this manner, oscillator unit 800 generates electromagnetic waves in the form of millimeter waves having a frequency of about 95 gigahertz.

Bias circuitry 820 is configured to receive power from a power supply through transmission lines. The power supply may be a direct current power supply in this illustrative example.

Figure 9:
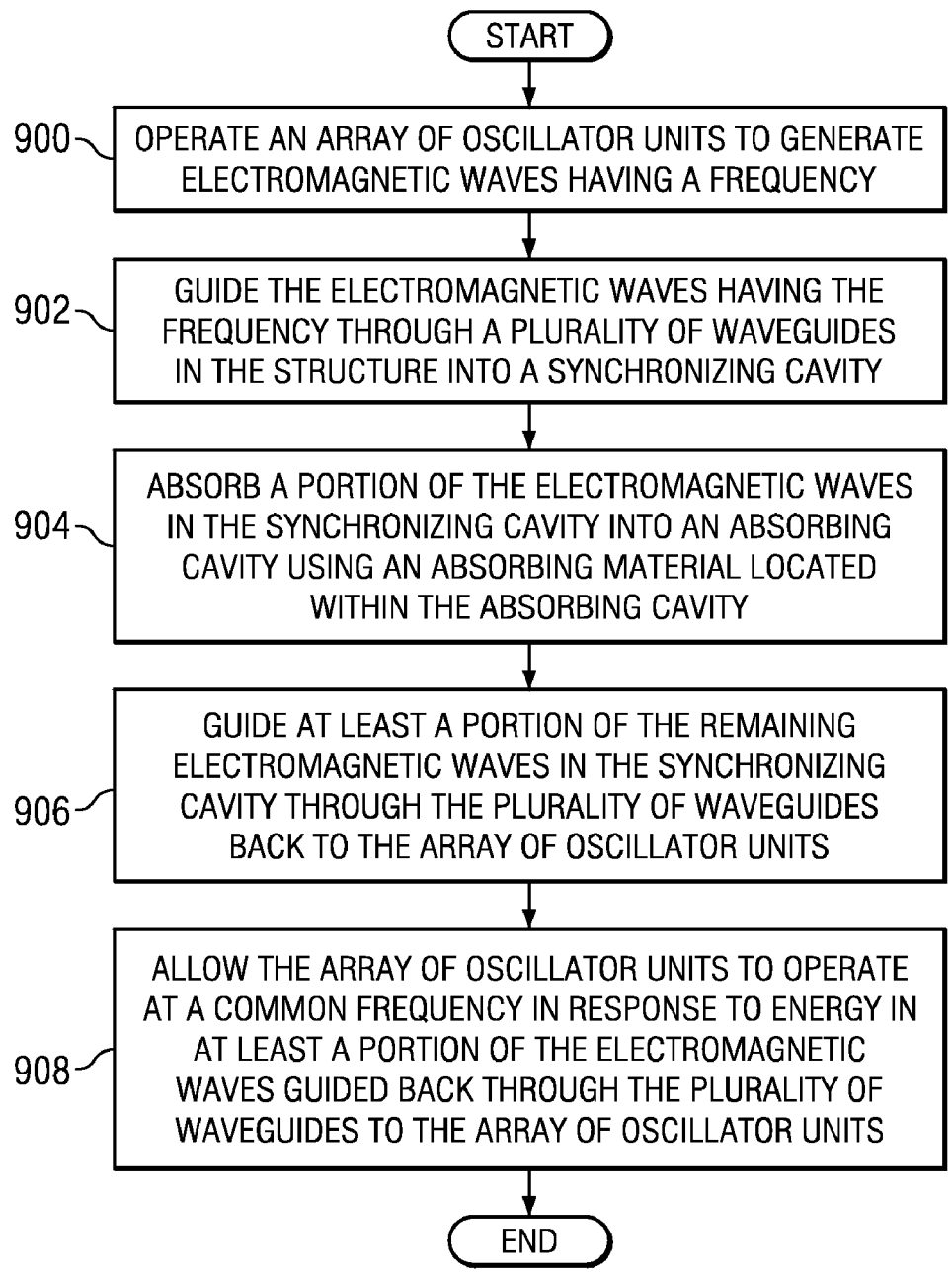
FIG. 9 is an illustration of a flowchart of a process for generating electromagnetic waves in accordance with an advantageous embodiment.

With reference now to FIG. 9, an illustration of a flowchart of a process for generating electromagnetic waves is depicted in accordance with an advantageous embodiment. The process illustrated in FIG. 9 may be implemented using electromagnetic wave source 100 in FIG. 1 and electromagnetic wave source 202 in FIG. 2.

The process begins by operating an array of oscillator units to generate electromagnetic waves having a frequency (operation 900). The array of oscillators has a plurality of rows, a plurality of columns, and is associated with a structure. Oscillator units in a row in the plurality of rows are directly coupled to each other.

The process then guides the electromagnetic waves having the frequency through a plurality of waveguides in the structure into a synchronizing cavity (operation 902). In operation 902, the plurality of waveguides is configured to couple the array of oscillator units to the synchronizing cavity. Further, the dimensions for the plurality of waveguides are selected to allow the electromagnetic waves having the frequency to travel through the plurality of waveguides.

Thereafter, the process absorbs a portion of the electromagnetic waves in the synchronizing cavity into an absorbing cavity using an absorbing material located within the absorbing cavity (operation 904). In operation 904, the portion of the electromagnetic waves may be directed into the absorbing cavity through a number of slots in a plate. The number of slots may be aligned with a direction for an electric field pattern for a desired mode for the electromagnetic waves. In this manner, the portion of the electromagnetic waves absorbed may have modes other than the desired mode for the electromagnetic waves.

The process then guides at least a portion of the remaining electromagnetic waves in the synchronizing cavity through the plurality of waveguides back to the array of oscillator units (operation 906). In these illustrative examples, at least a portion of the remaining electromagnetic waves may be part of or all of the remaining electromagnetic waves.

The process then allows the array of oscillator units to operate at a common frequency in response to energy in at least a portion of the electromagnetic waves guided back through the plurality of waveguides to the array of oscillator units (operation 908), with the process terminating thereafter. In operation 908, the array of oscillators is allowed to operate at the common frequency during operation of the array of oscillator units without receiving external input.

In other words, during operation of the array of oscillator units, the array of oscillator units synchronizes to the common frequency in response to the energy independent of external input. However, in other advantageous embodiments, external adjustments may be made to tune the array of oscillator units to the common frequency in addition to allowing the array of oscillator units to operate at the common frequency.

In this manner, the oscillator units in the array of oscillator units are coupled through the synchronizing cavity. This coupling of the array of oscillator units allows the electromagnetic waves generated by the array of oscillator units to have the common frequency.

In this manner, the array of oscillator units may synchronize each other to generate electromagnetic waves having the common frequency. The process illustrated in FIG. 9 may be performed continuously during the operation of the array of oscillator units.

The flowchart and block diagrams in the different depicted embodiments illustrate the architecture, functionality, and operation of some possible implementations of apparatus and methods in different advantageous embodiments. In this regard, each block in the flowchart or block diagrams may represent a module, segment, function, and/or portion of an operation or step.

In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved. Also, other blocks may be added in addition to the illustrated blocks in a flowchart or block diagram. For example, in different advantageous embodiments, operation 904 and operation 906 may be performed at the same time.

Thus, the different advantageous embodiments provide a method and apparatus for generating electromagnetic waves. In one or more advantageous embodiments, an apparatus comprises a structure, an array of oscillator units, a plurality of waveguides, and a cavity. The array of oscillator units has a plurality of rows and a plurality of columns on the structure. Oscillator units within the array of oscillator units in a row are directly connected to each other. The plurality of waveguides is found within the structure. The cavity is located within the structure. The plurality of waveguides is configured to couple the array of oscillator units to the cavity. The cavity is configured to cause the array of oscillator units to operate at a common frequency.

In other advantageous embodiments, the cavity is a first cavity, and a second cavity is also located within a coupling structure. The second cavity is configured to receive electromagnetic signals generated by the oscillators that have a mode, other than a desired mode, into the second cavity. An absorbing material in the second cavity is configured to absorb the electromagnetic signals that enter the second cavity.

The description of the different advantageous embodiments has been presented for purposes of illustration and description and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
  a structure;
  an array of oscillator units having a plurality of rows and a plurality of columns associated with the structure, wherein oscillator units in a row within the array of oscillator units are directly coupled to each other;
  a plurality of waveguides in the structure;
  a synchronizing cavity located within the structure, wherein the plurality of waveguides is configured to couple the array of oscillator units to the synchronizing cavity and wherein the synchronizing cavity is configured to cause the array of oscillator units to operate at substantially a common frequency;
  a first plate, wherein the plurality of waveguides is located within the first plate; and
  a second plate substantially parallel to the first plate, the second plate comprised of a conductive material, wherein the synchronizing cavity is located between the first plate and the second plate.

2. The apparatus of claim 1 further comprising:
  an absorbing cavity located in the structure, wherein the second plate separates the synchronizing cavity from the absorbing cavity;
  a number of slots within the second plate, wherein the number of slots couples the synchronizing cavity to the absorbing cavity, and wherein the number of slots is configured to direct electromagnetic waves having a mode other than a desired mode into the absorbing cavity; and an absorbing material located within the absorbing cavity, wherein the absorbing material is configured to absorb the electromagnetic waves that enter the absorbing cavity.

3. The apparatus of claim 2, wherein the number of slots is aligned in a direction corresponding to a direction of an electric field pattern for the desired mode within the synchronizing cavity.

4. The apparatus of claim 1, wherein oscillator units in a first row in the array of oscillator units are about 180 degrees out of phase from oscillator units in a second row in the array of oscillator units adjacent to the first row.

5. The apparatus of claim 1, wherein the plurality of waveguides is a first plurality of waveguides, and further comprising:

a second plurality of waveguides in the structure; and an antenna system associated with the structure, wherein the second plurality of waveguides is configured to couple the array of oscillator units to the antenna system.

6. The apparatus of claim 5, wherein a number of waveguides in the second plurality of waveguides is located between a first row and a second row in the plurality of rows in the array of oscillator units.

7. The apparatus of claim 1, wherein electromagnetic waves emitted from the array of oscillator units have a frequency that is a harmonic of the common frequency.

8. The apparatus of claim 7, wherein the electromagnetic waves emitted from the array of oscillator units are emitted in a substantially collimated beam.

9. The apparatus of claim 1, wherein the array of oscillator units is configured with odd symmetry.

10. The apparatus of claim 9, wherein each oscillator unit in the array of oscillator units is formed on a monolithic microwave integrated circuit.

11. The apparatus of claim 1, wherein each oscillator unit in the array of oscillator units comprises a first transistor, a second transistor, and an output combiner configured to allow electromagnetic waves having a frequency that is a harmonic of the common frequency to pass through an output circuit.

12. The apparatus of claim 11, wherein the output combiner is connected to an output from the first transistor and the second transistor, and wherein the output combiner is configured to allow the electromagnetic waves having the frequency that is the harmonic of the common frequency to pass through the output combiner.

13. The apparatus of claim 12 further comprising:

an amplifier connected to an output of the output combiner.

14. The apparatus of claim 11, wherein the common frequency is a fundamental frequency and the frequency that is the harmonic is a second harmonic of the fundamental frequency.

15. An apparatus comprising:

a structure having a first plate and a second plate, wherein the first plate and the second plate are substantially parallel to each other;

an array of oscillator units having a plurality of rows and a plurality of columns associated with the structure, wherein oscillator units in a row in the array of oscillator units are directly coupled to each other;

a first plurality of waveguides located in the first plate of the structure;

a synchronizing cavity located between the first plate and the second plate of the structure, wherein the first plurality of waveguides is configured to couple the array of oscillator units to the synchronizing cavity and wherein the synchronizing cavity is configured to cause the array of oscillator units to operate at a common frequency;

an absorbing cavity located in the structure, wherein the second plate of the structure separates the synchronizing cavity from the absorbing cavity, wherein a number of slots within the second plate couples the synchronizing cavity to the absorbing cavity, and wherein the number of slots is configured to direct electromagnetic waves having a mode other than a desired mode into the absorbing cavity;

an absorbing material located in the absorbing cavity, wherein the absorbing material is configured to absorb the electromagnetic waves that enter the absorbing cavity;

a second plurality of waveguides located in the structure; and an antenna system associated with the structure, wherein the second plurality of waveguides is configured to couple the array of oscillator units to the antenna system.

16. The apparatus of claim 15, wherein the number of slots is aligned in a direction corresponding to a direction of an electric field pattern for the desired mode within the synchronizing cavity.

17. The apparatus of claim 15, wherein oscillator units in a first row in the array of oscillator units are about 180 degrees out of phase from oscillator units in a second row in the array of oscillator units adjacent to the first row.

18. The apparatus of claim 15, wherein the array of oscillator units emits the electromagnetic waves having a frequency that is a harmonic of the common frequency in a substantially collimated beam.

19. The apparatus of claim 18, wherein each oscillator unit in the array of oscillator units comprises a first transistor, a second transistor, and an output circuit configured to allow the electromagnetic waves having the frequency that is the harmonic of the common frequency to pass through the output circuit.

20. The apparatus of claim 18, wherein the common frequency is a fundamental frequency and the frequency that is the harmonic is a second harmonic of the fundamental frequency.

21. A method for generating electromagnetic waves, the method comprising;

operating an array of oscillator units to generate the electromagnetic waves having a frequency, wherein the array of oscillator units has a plurality of rows and a plurality of columns associated with a structure, and wherein oscillator units in a row within the array of oscillator units are directly connected to each other;

guiding the electromagnetic waves having the frequency through a plurality of waveguides in the structure into a synchronizing cavity located within the structure, wherein the plurality of waveguides is configured to couple the array of oscillator units to the synchronizing cavity;

absorbing a portion of the electromagnetic waves in the synchronizing cavity into an absorbing cavity using an absorbing material located within the absorbing cavity, wherein the portion of the electromagnetic waves absorbed has modes other than a desired mode for the electromagnetic waves;

guiding at least a portion of remaining electromagnetic waves in the synchronizing cavity back through the plurality of waveguides to the array of oscillator units;

allowing the array of oscillator units to operate at a common frequency in response to energy in the at least a portion of the remaining electromagnetic waves guided back through the plurality of waveguides to the array of oscillator units, wherein the electromagnetic waves generated by the array of oscillator units have the common frequency.

22. The method of claim 21, wherein the step of guiding the electromagnetic waves having the frequency through the plurality of waveguides in the structure into the synchronizing cavity located within the structure, wherein the plurality of waveguides is configured to couple the array of oscillator units to the synchronizing cavity comprises:

guiding the electromagnetic waves having the frequency through the plurality of waveguides in the structure into the synchronizing cavity located within the structure, wherein the structure comprises a first plate and a second plate, wherein the first plate and the second plate are substantially parallel to each other, wherein the plurality of waveguides are located within the first plate, wherein the synchronizing cavity is located between the first plate and the second plate, and wherein the plurality of waveguides is configured to couple the array of oscillator units to the synchronizing cavity.

* * * * *